United States Patent
Khorram (10) Patent No.: US 7,167,692 B2
(45) Date of Patent: Jan. 23, 2007

(54) HIGH FREQUENCY PEAK DETECTOR AND APPLICATIONS THEREOF

(75) Inventor: Shahla Khorram, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 485 days.

(21) Appl. No.: 10/802,020

(22) Filed: Mar. 16, 2004

(65) Prior Publication Data

US 2005/0208923 A1     Sep. 22, 2005

(51) Int. Cl.
  *H04B 17/00* (2006.01)
  *H03C 1/62* (2006.01)
  *G01R 19/00* (2006.01)
(52) U.S. Cl. .................. 455/115.3; 455/226.2; 327/58
(58) Field of Classification Search ............. 455/67.11, 455/115.1, 115.3, 115.4, 226.1, 226.2, 226.4; 327/58, 62
See application file for complete search history.

(56) References Cited

U.S. PATENT DOCUMENTS 5,969,545 A * 10/1999 Assadian et al. ............. 327/62
6,977,531 B1 * 12/2005 Chien ........................... 327/62

* cited by examiner

*Primary Examiner*—Nguyen T. Vo
(74) *Attorney, Agent, or Firm*—Garlick Harrison & Markison; Timothy W. Markison (57) ABSTRACT

A high frequency peak detector includes an operational amplifier, a transistor, a capacitor, and an average to peak conversion module. A first inverting input of the operational amplifier receives a high frequency input signal, a second inverting input of the operational amplifier receives a common mode voltage of the high frequency signal, and a non-inverting input of the operational amplifier is coupled to the output of the operational amplifier. A gate of the transistor is operably coupled to the output of the operational amplifier and the source of the transistor is operably coupled to a power supply. The capacitor is operably coupled to the drain of the transistor to provide an analog signal representing an average peak to common mode value of the high frequency signal and to a circuit ground. The average to peak conversion module determines a peak value of the high frequency signal based on the analog signal and the common mode value.

14 Claims, 6 Drawing Sheets

TSSI module 95

FIG. 3
TSSI module 95

FIG. 4
TSSI module 95

FIG. 5
TSSI module 95

FIG. 6

HIGH FREQUENCY PEAK DETECTOR AND APPLICATIONS THEREOF

BACKGROUND OF THE INVENTION

1. Technical Field of the Invention

This invention relates generally to wireless communications and more particularly to accurately measuring transmits signal strength of such wireless communications.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is further known, many transmitters include a transmit signal strength indication (TSSI) module that measures the signal strength of the RF signals at the output of the power amplifier. The measured signal strength is used to adjust gain of the power amplifier, regulate a constant transmit power, and other power conserving operations. Accordingly, for such operations to be accurately performed, the measured signal strength must be accurate.

One common embodiment of a TSSI module includes a peak detector and a peak-to-power conversion module. The peak detector includes an operational amplifier having a non-inverting input, an inverting input, and an output, where the inverting input is coupled to receive the RF signals. The peak detector also includes a transistor and a capacitor. The transistor includes a gate, a drain, and a source. The gate of the transistor is coupled to the output of the operational amplifier and the drain of the transistor is coupled to the non-inverting input of the operational amplifier and to one plate of the capacitor to provide an output of the peak detector. The other plate of the capacitor is coupled to a circuit ground and the source of the transistor is coupled to a power supply voltage. As coupled, the peak detector measures peaks of the transmitted RF signals with respect to a circuit ground. The peak-to-power conversion module converts the measured peak values into a corresponding power to produce a transmit signal strength indication.

An issue arises with such a peak detector when the frequency of the transmitted RF signals enters the giga-Hertz range in that, the signal is transitioning too fast for the peak detector to accurately determine the peak value. In this instance, the peak detector provides an average value with respect to the circuit ground, which yields inaccurate transmit signal strength indications.

Therefore, a need exists for a high frequency peak detector that provides an accurate measure of peak values of high frequency signals, including radio frequency signals.

BRIEF SUMMARY OF THE INVENTION

The high frequency peak detector of the present invention substantially meets these needs and others. In one embodiment, a high frequency peak detector includes an operational amplifier, a transistor, a capacitor, and an average to peak conversion module. The operational amplifier includes a first inverting input, a second inverting input, a non-inverting input and an output, wherein the first inverting input is operably coupled to receive a high frequency input signal, the second inverting input is operably coupled to receive a common mode voltage of the high frequency signal, and wherein the non-inverting input is operably coupled to the output of the operational amplifier. The transistor includes a gate, a drain, and a source, wherein the gate of the transistor is operably coupled to the output of the operational amplifier and the source of the transistor is operably coupled to a power supply. The capacitor includes a first plate and a second plate, wherein the first plate of the capacitor is operably coupled to the drain of the transistor to provide an analog signal representing an average peak to common mode value of the high frequency signal and the second plate of the capacitor is operably coupled to a circuit ground. The average to peak conversion module is operably coupled to determine a peak value of the high frequency signal based on the analog signal and the common mode value.

DETAILED DESCRIPTION OF THE INVENTION

Figure 1:
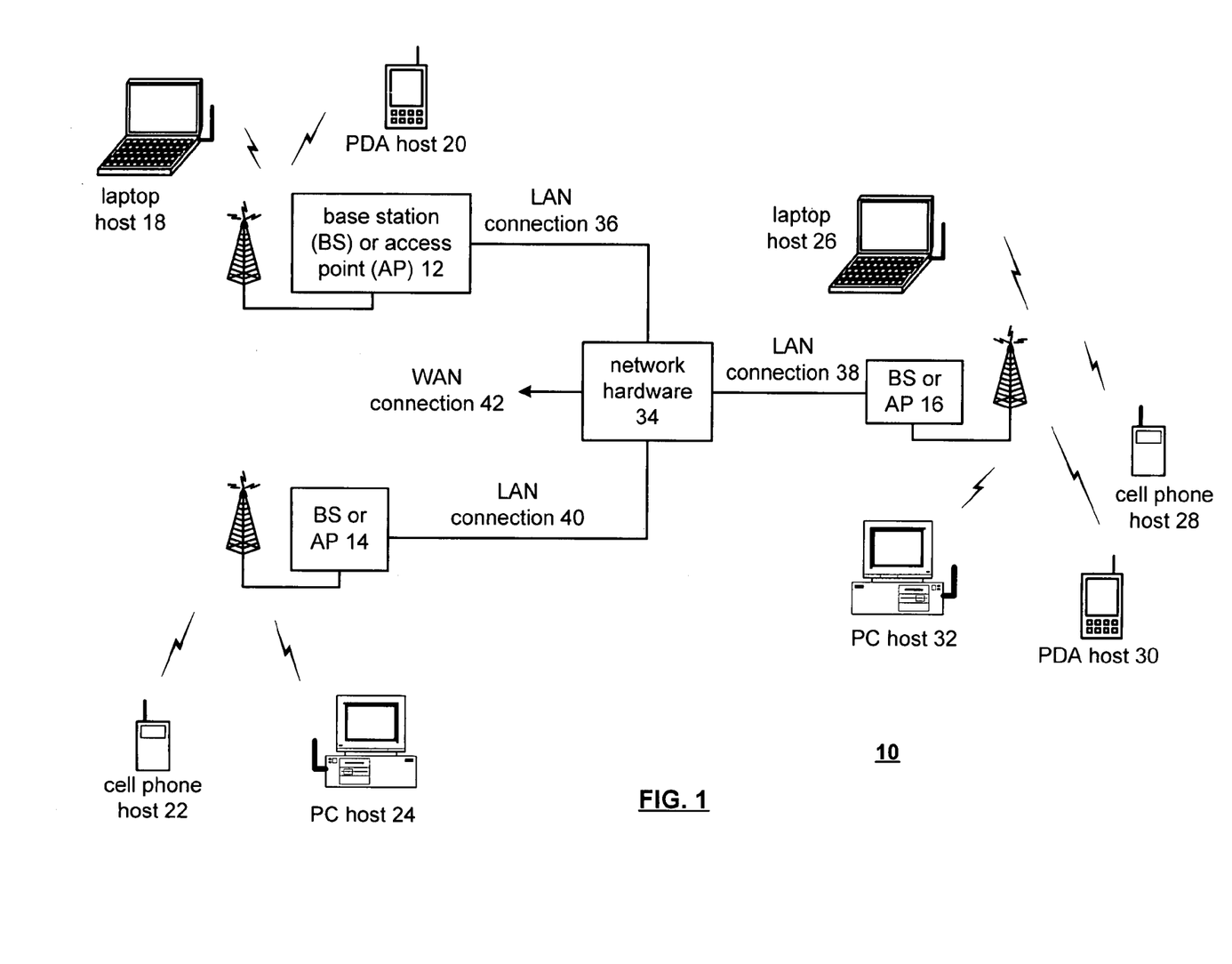
FIG. 1 is a schematic block diagram of a wireless communication system in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
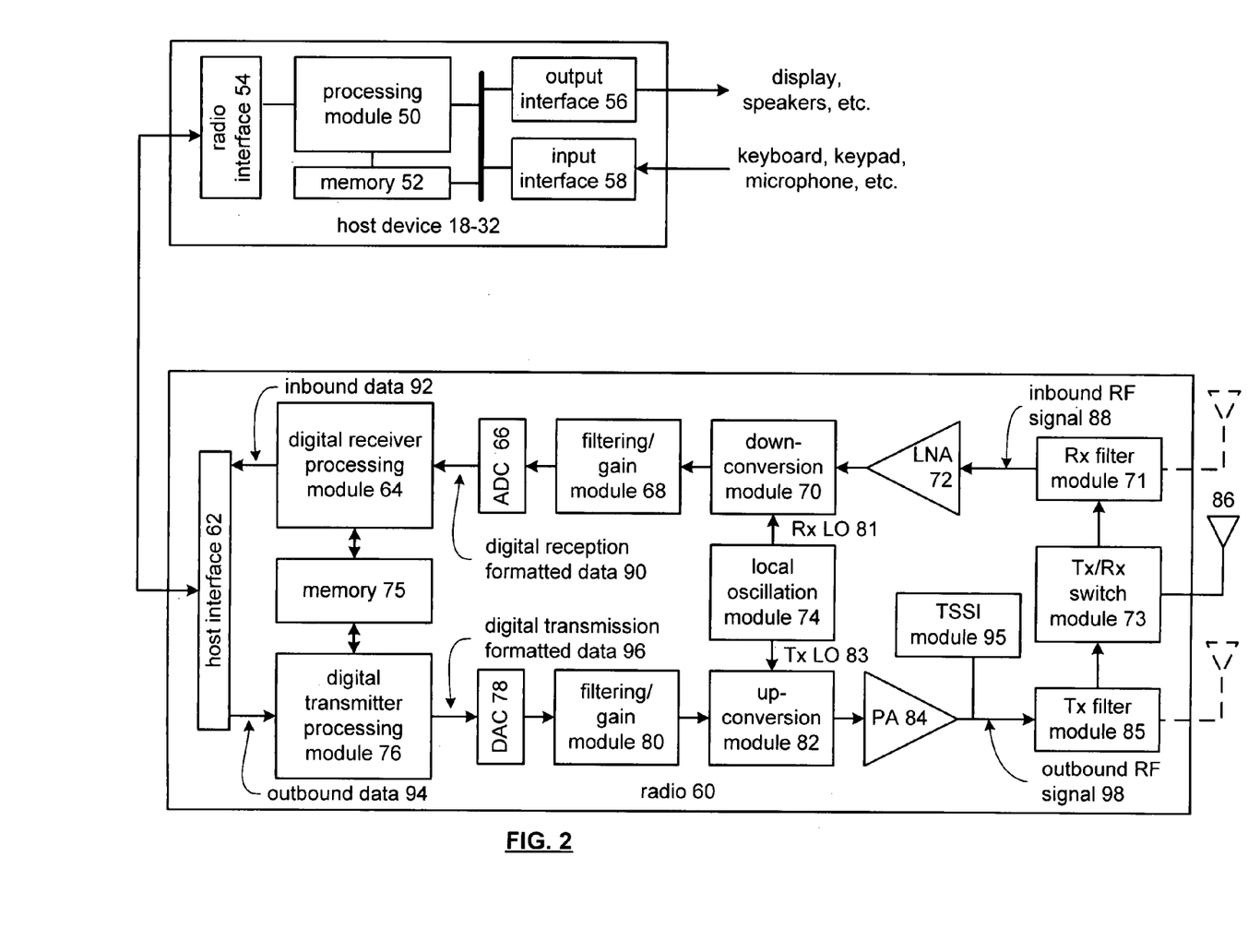
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, an antenna 86, and a transmit signal strength indication (TSSI) module 95, which will be described in greater detail with reference to FIGS. 3–6. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
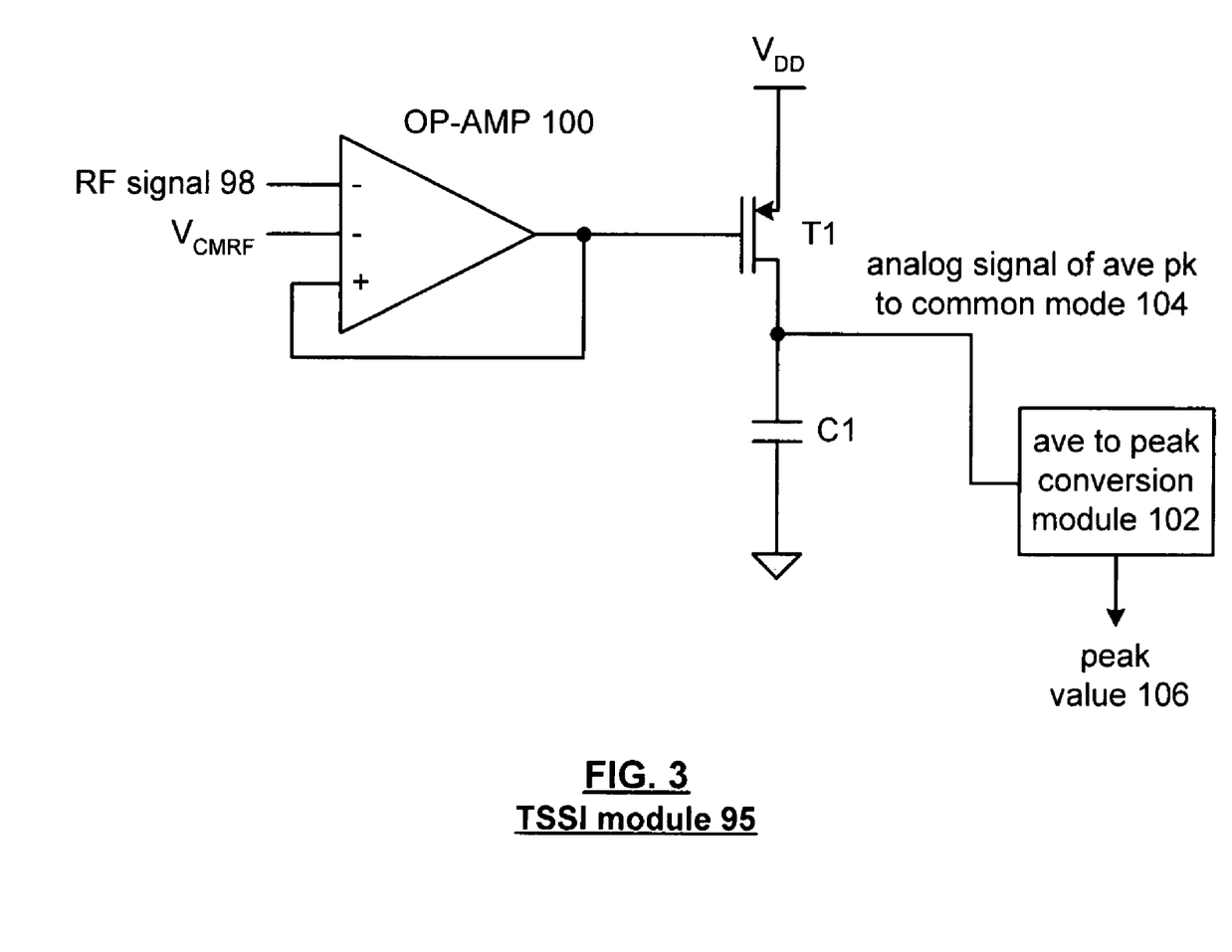
FIG. 3 is a schematic block diagram of a transmit signal strength indication (TSSI) module in accordance with the present invention.

FIG. 3 is a schematic block diagram of a transmit signal strength indication (TSSI) module 95 that includes an operational amplifier 100, a transistor $T_1$, a capacitor C1 and an average-to-peak conversion module 102. The operational amplifier 100 includes a $1^{st}$ inverting input coupled to receive the RF signal 98, a $2^{nd}$ inverting input operably coupled to receive the common mode voltage of RF signal 98 and a non-inverting input coupled to the output of the operational amplifier 100. The output of operational amplifier 100 is also coupled to the gate of transistor $T_1$. The drain of transistor $T_1$ is coupled to capacitor C1 such that the voltage across capacitor C1 corresponds to an analog signal that represents the average peak to common mode voltage 104 of the RF signal 98.

The average-to-peak conversion module 102 receives the analog signal 104 and produces therefrom a peak value 106. As one of average skill in the art will appreciate, by obtaining the average-to-peak common mode voltage and knowing the common mode voltage, the average-to-peak conversion module 102 may readily use the mathematical properties of a sine wave to determine a corresponding peak value.

Figure 4:
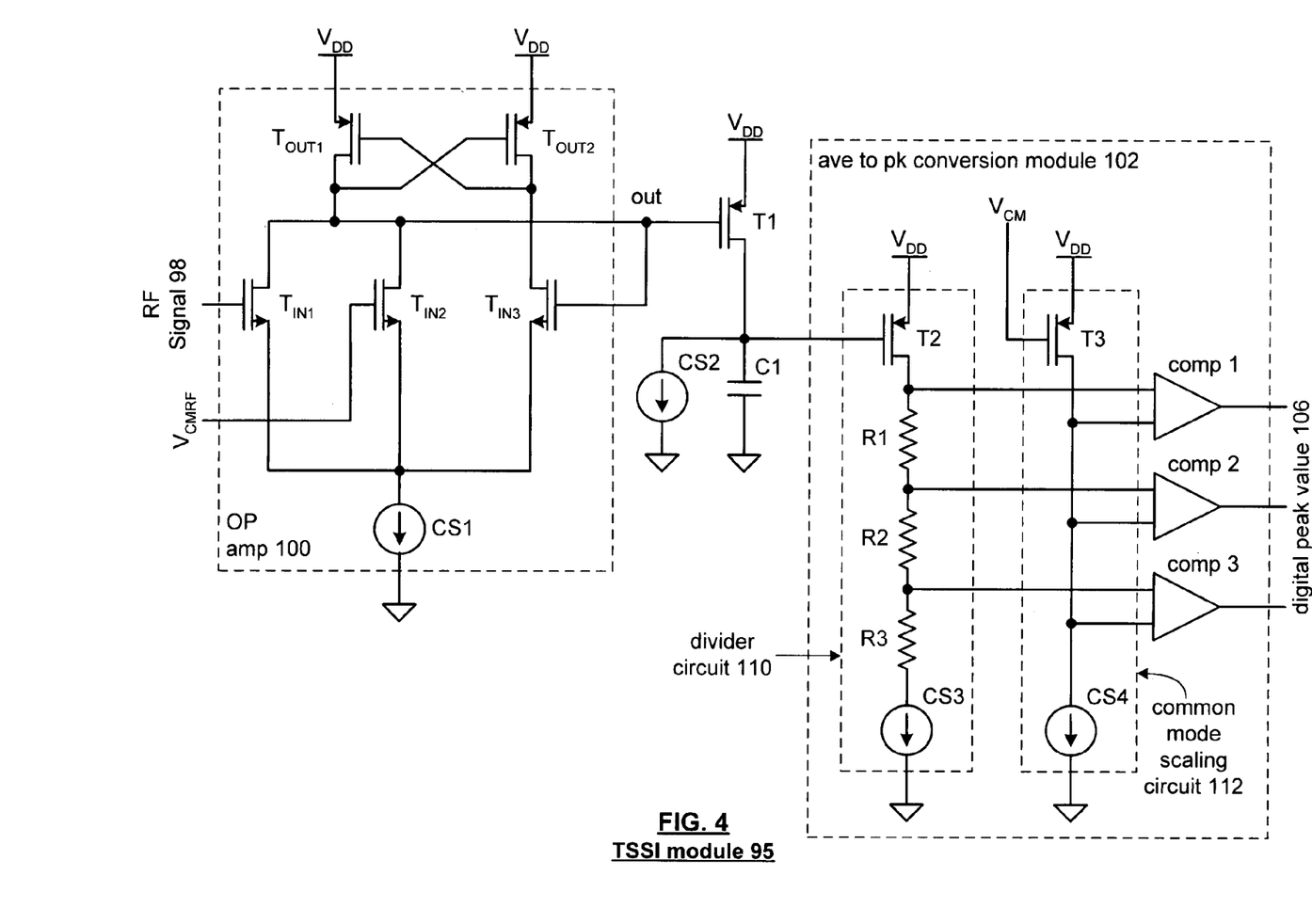
FIG. 4 is a schematic block diagram of another embodiment of a TSSI module in accordance with the present invention.

FIG. 4 is a schematic block diagram of an embodiment of a TSSI module 95 that includes the operational amplifier 100, capacitor C1, transistor $T_1$, a current source C2, and the average-to-peak conversion module 102. In this embodiment, the average-to-peak conversion module 102 includes a divider circuit 110 and a common mode scaling circuit 112. The divider circuit 110 includes a transistor $T_2$, a resistive divider network R1–R3, and a current source C3. The common mode scaling circuit 112 includes a transistor $T_3$ and a current source C4. The average-to-peak conversion module 102 also includes a plurality of comparators (COMP1–COMP3).

The operational amplifier 100 includes three input transistors $T_{IN1}$, $T_{IN2}$ and $T_{IN3}$, a current source C1, and a pair of output transistors $T_{OUT1}$ and $T_{OUT2}$. The gate of the $1^{st}$ input transistor $T_{IN1}$ is operably coupled to receive the RF signal 98 and the gate of the $2^{nd}$ input transistor $T_{IN2}$ is operably coupled to receive the common mode voltage of the RF signal 98. The gate of the $3^{rd}$ input transistor is operably coupled to the output of the operational amplifier 100.

In operation, the operational amplifier 100 produces an output that corresponds to an average peak to common mode voltage. Such an analog signal is produced with the $1^{st}$ input transistor $T_{IN1}$ providing a majority of the current to the current source CS1 when the RF signal 98 is high in comparison with the common mode reference voltage and the corresponding output voltage. As the RF signal 98 decreases in magnitude, the current through input transistor $T_{IN1}$ will decrease causing an increase in current through transistors $T_{IN2}$ and $T_{IN3}$. In this configuration, by controlling the current through the transistors in such a manner, the operational amplifier produces an output that corresponds to an average peak to common mode voltage.

The voltage across C1 corresponds to an average peak to common mode analog voltage 104 that is dissipated via current source C2. In addition, the voltage is fed into the transistor of divider circuit 110.

The divider circuit 110 divides the analog voltage 104 into a plurality of voltages that are compared via comparators 1–3 with a scaled common mode voltage that is produced by the common mode scaling circuit 112. The resulting output of the comparators produces a digital value of the peak value 106. As one of average skill in the art will appreciate, divider circuit 10 may include more resistors within the divider network to produce more voltages and the number of comparators may increase accordingly.

Figure 5:
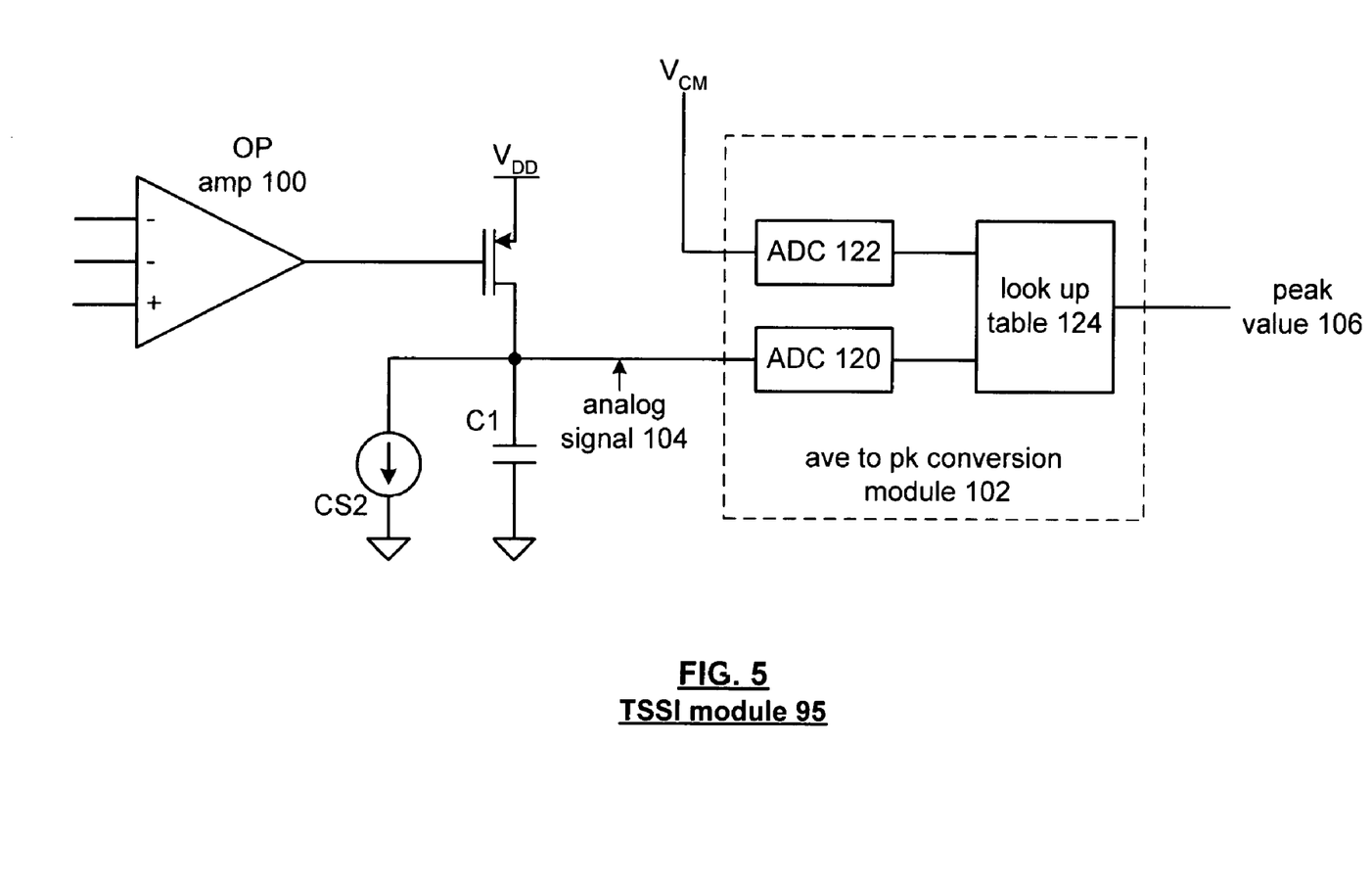
FIG. 5 is a schematic block diagram of yet another embodiment of a TSSI module in accordance with the present invention.

FIG. 5 is a schematic block diagram of another embodiment of the TSSI module 95. In this embodiment, the operational amplifier 100 is coupled to transistor $T_1$ and capacitor C1, which produces the analog signal 104. The average-to-peak conversion module 102 includes two analog-to-digital converters 120 and 122 and a look-up table 124. The operation of the amplifier 100, capacitor C1 and transistor $T_1$ function as previously described with reference to FIG. 3. The average-to-peak conversion module 102 converts the analog signal 104 into a digital signal via analog-to-digital converter 120. Similarly, analog-to-digital converter 122 converts the common mode voltage of RF signal into a digital value. The digital outputs of analog-to-digital converters 122 and 120 are used as an index to look-up table 124 to determine a corresponding peak value 106.

Figure 6:
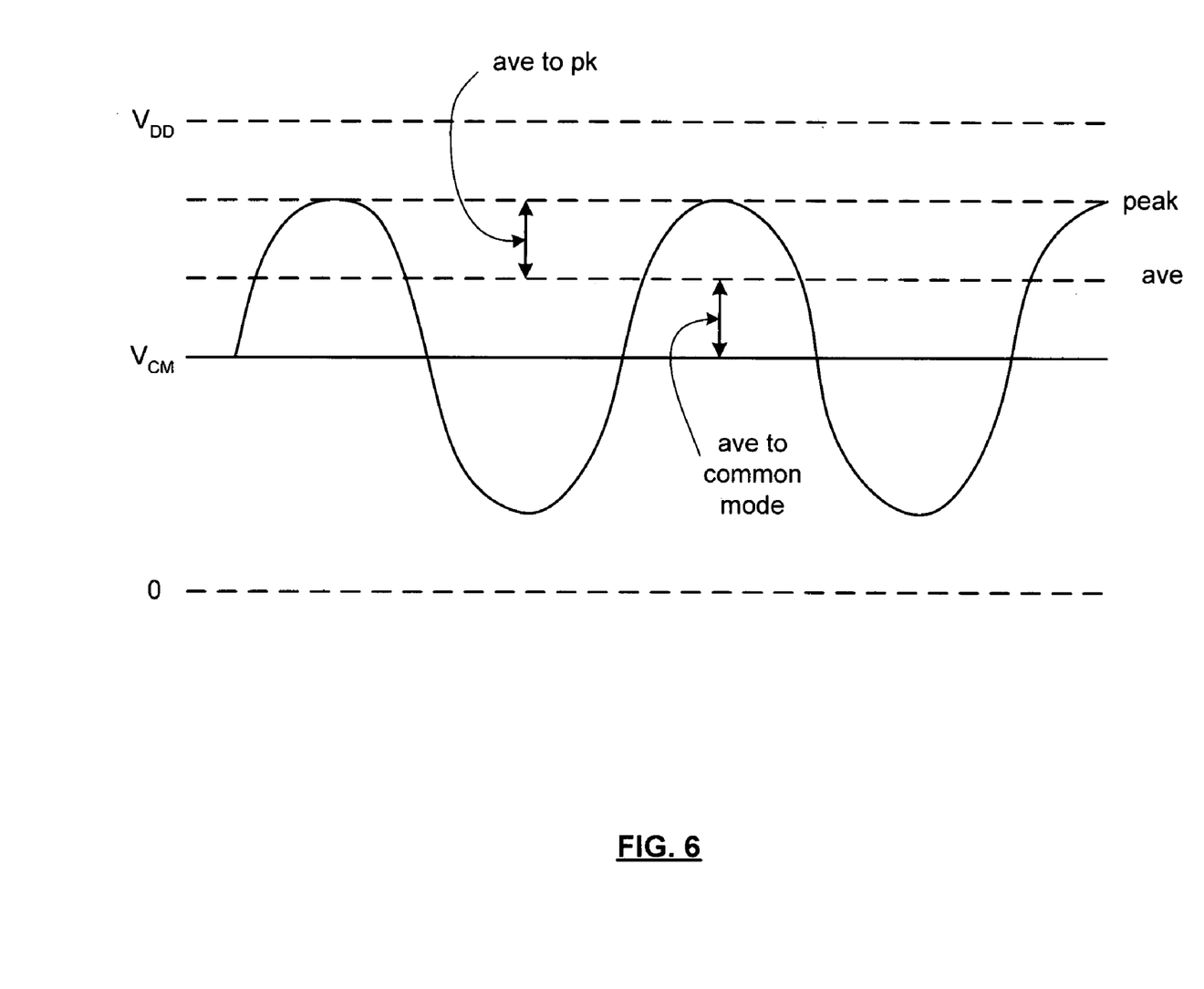
FIG. 6 is a diagram of an example of operation of a TSSI module in accordance with the present invention.

FIG. 6 illustrates a graph of the operation of the TSSI modules of FIGS. 3–5. In this embodiment, a RF signal is represented as a sine wave that is centered about a common mode voltage ($V_{CM}$). The supply rails of an integrated circuit supporting the TSSI module are shown as 0 volts and $V_{dd}$ which corresponds to the power supply. The operational amplifier 100, transistor $T_1$ and capacitor C1 produce the average-to-common mode voltage, which is labeled AVE to Common Mode. This value is then used by the average-to-peak conversion module 102 along with the common mode voltage to determine an average-to-peak voltage (AVE to PK) and/or a common mode voltage to peak voltage. From either of these voltages and the common mode voltage, the peak value 106 with respect to ground may readily be determined based on sine wave properties having the average-to-peak value.

For example, let the RF signal 98 be represented by $A \sin(\omega_{RF}t)$, where A is amplitude of the RF signal with respect to the common mode voltage. The average value of the signal is $A/\sqrt{2}$ with respect to the common mode voltage. From this value, A can readily be determined and since the common mode voltage is known, the peak value is A plus the common mode voltage.

As one of average skill in the art will appreciate, the determination of the peak value may also be computed based on a fully rectified version of the RF signal with respect to the common node voltage. This may be done by adding an extra input transistor coupled in parallel to the existing transistors and having its gate coupled to receive a negative leg of the RF signal 98, when the RF signal 98 is a differential signal or to receive an inversion of the RF signal 98.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an accurate TSSI module that may be used within radio frequency integrated circuits. As one of average skill in the art will appreciate, other embodiments may be derived from the teaching of the present invention without deviating from the scope of the claims.

What is claimed is:

1. A high frequency peak detector comprises:
   an operational amplifier having a first inverting input, a second inverting input, a non-inverting input and an output, wherein the first inverting input is operably coupled to receive a high frequency input signal, the second inverting input is operably coupled to receive a common mode voltage of the high frequency signal, and wherein the non-inverting input is operably coupled to the output of the operational amplifier;
   a transistor having a gate, a drain, and a source, wherein the gate of the transistor is operably coupled to the output of the operational amplifier and the source of the transistor is operably coupled to a power supply;
   a capacitor having a first plate and a second plate, wherein the first plate of the capacitor is operably coupled to the drain of the transistor to provide an analog signal representing an average peak to common mode value of the high frequency signal and the second plate of the capacitor is operably coupled to a circuit ground; and
   an average to peak conversion module operably coupled to determine a peak value of the high frequency signal based on the analog signal and the common mode value.

2. The high frequency peak detector of claim 1 further comprises:
   a leakage current source operably coupled to parallel with the capacitor.

3. The high frequency peak detector of claim 1, wherein the operational amplifier comprises:
   a first input transistor having a gate, a drain, and a source, wherein the gate of the first input transistor provides the first inverting input;
   a second input transistor having a gate, a drain, and a source, wherein the gate of the second input transistor provides the second inverting input;
   a third input transistor having a gate, a drain, and a source, wherein the gate of the third input transistor provides the non-inverting input;
   a current source having a first node and a second node, wherein the first node of the current source is operably coupled to the sources of the first, second, and third input transistors and the second node of the current source is operably coupled to the circuit ground;

a first output transistor having a gate, a drain, and a source, wherein the drain of the first output transistor is operably coupled to the drains of the first and second input transistors to provide the output and the source of the first output transistor is operably coupled to the power supply; and a second output transistor having a gate, a drain, and a source, wherein the drain of the second output transistor is operably coupled to the drain of the third input transistor, the gate of the second output transistor is coupled to the drain of the first output transistor, and the source of the second output transistor is operably coupled to the power supply.

4. The high frequency peak detector of claim 1, wherein the average to peak conversion module comprises:

a divider circuit operably coupled to convert the analog signal into a plurality of analog voltages;

a common mode scaling circuit operably coupled to provide a scaled common mode voltage of the common mode voltage; and a plurality of comparators operably coupled to compare the plurality of analog voltages to the scaled common mode voltage to produce a digital value representing the peak value.

5. The high frequency peak detector of claim 4, wherein the divider circuit comprises:

an input transistor having a gate, a drain, and a source, wherein the gate of the input transistor is operably coupled to receive the analog signal and the source of the input transistor is operably coupled to the power supply;

resistive divider network having a first node, a second node, and a plurality of taps, wherein the first node of the resistor divider is operably coupled to the drain of the input transistor and the plurality of taps provides the plurality of analog voltages; and a current source having a first node and a second node, wherein the first node of the current source is coupled to the second node of the resistive divider and the second node of the current source is operably coupled to the circuit ground.

6. The high frequency peak detector of claim 4, wherein the common mode scaling circuit comprises:

an input transistor having a gate, a drain, and a source, wherein the gate of the input transistor is operably coupled to receive the common mode voltage and the source of the input transistor is operably coupled to the power supply; and a current source having a first node and a second node, wherein the first node of the current source is coupled to the drain of the input transistor to provide the scaled common mode voltage and the second node of the current source is operably coupled to the circuit ground.

7. The high frequency peak detector of claim 1, wherein the average to peak conversion module comprises:

a first analog to digital converter operably coupled to convert the analog signal into a digital signal;

a second analog to digital converter operably coupled to convert the common mode voltage into a second digital signal; and look up table addressed by the digital signal and the second digital signal to retrieve the peak value of the high frequency signal.

8. A radio frequency integrated circuit (RFIC) comprises:

a receiver section operably coupled to convert inbound radio frequency (RF) signals into inbound data;

a transmitter section operably coupled to converter outbound data into outbound RF signals; and a transmit signal strength indication (TSSI) module operably coupled to determine transmit power of the outbound RF signals, wherein the TSSI module includes:

an operational amplifier having a first inverting input, a second inverting input, a non-inverting input and an output, wherein the first inverting input is operably coupled to receive the outbound RF signals, the second inverting input is operably coupled to receive a common mode voltage of the outbound RF signals, and wherein the non-inverting input is operably coupled to the output of the operational amplifier;

a transistor having a gate, a drain, and a source, wherein the gate of the transistor is operably coupled to the output of the operational amplifier and the source of the transistor is operably coupled to a power supply;

a capacitor having a first plate and a second plate, wherein the first plate of the capacitor is operably coupled to the drain of the transistor to provide an analog signal representing an average peak to common mode value of the outbound RF signals and the second plate of the capacitor is operably coupled to a circuit ground; and an average to peak conversion module operably coupled to determine a peak value of the outbound RF signals based on the analog signal and the common mode value.

9. The RFIC of claim 8, wherein the TSSI further comprises:

a leakage current source operably coupled to parallel with the capacitor.

10. The RFIC of claim 8, wherein the operational amplifier comprises:

a first input transistor having a gate, a drain, and a source, wherein the gate of the first input transistor provides the first inverting input;

a second input transistor having a gate, a drain, and a source, wherein the gate of the second input transistor provides the second inverting input;

a third input transistor having a gate, a drain, and a source, wherein the gate of the third input transistor provides the non-inverting input;

a current source having a first node and a second node, wherein the first node of the current source is operably coupled to the sources of the first, second, and third input transistors and the second node of the current source is operably coupled to the circuit ground;

a first output transistor having a gate, a drain, and a source, wherein the drain of the first output transistor is operably coupled to the drains of the first and second input transistors to provide the output and the source of the first output transistor is operably coupled to the power supply; and a second output transistor having a gate, a drain, and a source, wherein the drain of the second output transistor is operably coupled to the drain of the third input transistor, the gate of the second output transistor is coupled to the drain of the first output transistor, and the source of the second output transistor is operably coupled to the power supply.

11. The RFIC of claim 8, wherein the average to peak conversion module comprises:

a divider circuit operably coupled to convert the analog signal into a plurality of analog voltages;

a common mode scaling circuit operably coupled to provide a scaled common mode voltage of the common mode voltage; and a plurality of comparators operably coupled to compare the plurality of analog voltages to the scaled common mode voltage to produce a digital value representing the peak value.

12. The RFIC of claim 11, wherein the divider circuit comprises:

an input transistor having a gate, a drain, and a source, wherein the gate of the input transistor is operably coupled to receive the analog signal and the source of the input transistor is operably coupled to the power supply;

resistive divider network having a first node, a second node, and a plurality of taps, wherein the first node of the resistor divider is operably coupled to the drain of the input transistor and the plurality of taps provides the plurality of analog voltages; and a current source having a first node and a second node, wherein the first node of the current source is coupled to the second node of the resistive divider and the second node of the current source is operably coupled to the circuit ground.

13. The RFIC of claim 11, wherein the common mode scaling circuit comprises:

an input transistor having a gate, a drain, and a source, wherein the gate of the input transistor is operably coupled to receive the common mode voltage and the source of the input transistor is operably coupled to the power supply; and a current source having a first node and a second node, wherein the first node of the current source is coupled to the drain of the input transistor to provide the scaled common mode voltage and the second node of the current source is operably coupled to the circuit ground.

14. The RFIC of claim 8, wherein the average to peak conversion module comprises:

a first analog to digital converter operably coupled to convert the analog signal into a digital signal;

a second analog to digital converter operably coupled to convert the common mode voltage into a second digital signal; and look up table addressed by the digital signal and the second digital signal to retrieve the peak value of the outbound RF signals.

* * * * *